United States Patent [19]
Bishop

[11] Patent Number: 6,043,134
[45] Date of Patent: Mar. 28, 2000

[54] SEMICONDUCTOR WAFER ALIGNMENT PROCESSES

[75] Inventor: Christopher C. Bishop, Meridian, Id.

[73] Assignee: Micron Technology, Inc., Boise, Id.

[21] Appl. No.: 09/143,044

[22] Filed: Aug. 28, 1998

[51] Int. Cl.[7] .................................................. H01L 21/76
[52] U.S. Cl. ......................... 438/401; 438/462; 438/800; 227/797
[58] Field of Search .................................... 438/401, 462, 438/800, 14; 228/193; 250/548

[56] References Cited

U.S. PATENT DOCUMENTS 5,236,118  8/1993  Bower et al. ............................. 228/193
5,477,058  12/1995  Sato ........................................ 250/548

*Primary Examiner*—Charles Bowers
*Assistant Examiner*—Craig Thompson
*Attorney, Agent, or Firm*—Wells, St. John, Roberts, Gregory & Matkin P.S.

[57] ABSTRACT

Semiconductor wafer alignment processes are described. In one embodiment, a first geometric shape is formed over a substrate and has a plurality of sides. A majority of the sides are formed along lines which intersect with another side's line at angles greater than 90°. A second geometric shape is formed over the first geometric shape and is substantially the same as, but different in dimension from the first geometric shape. The position of the shapes is inspected relative to one another to ascertain whether the shapes are misaligned. In another embodiment, an enclosed polygon is formed over the substrate and each of the polygon's sides is joined with another of the polygon's sides to define an angle greater than 90°. A shape is provided elevationally displaced from and received entirely inside the polygon when viewed from over the substrate. The relative positions of the polygon and the elevationally displaced shape are inspected for alignment. In another embodiment, a first shape is formed over a substrate and is defined by a side at least a portion of which is arcuate. A second shape is formed elevationally displaced from the first shape and is defined by a side at least a portion of which is arcuate. The second shape is different in dimension from the first shape. The relative positions of the first and second shapes are inspected to ascertain whether the shapes are properly aligned.

50 Claims, 3 Drawing Sheets

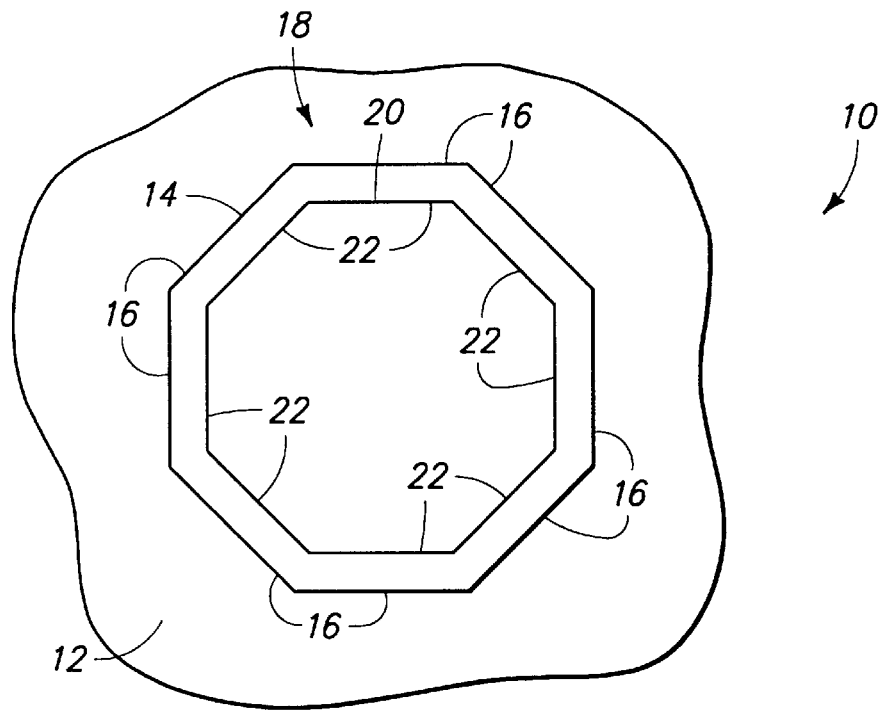
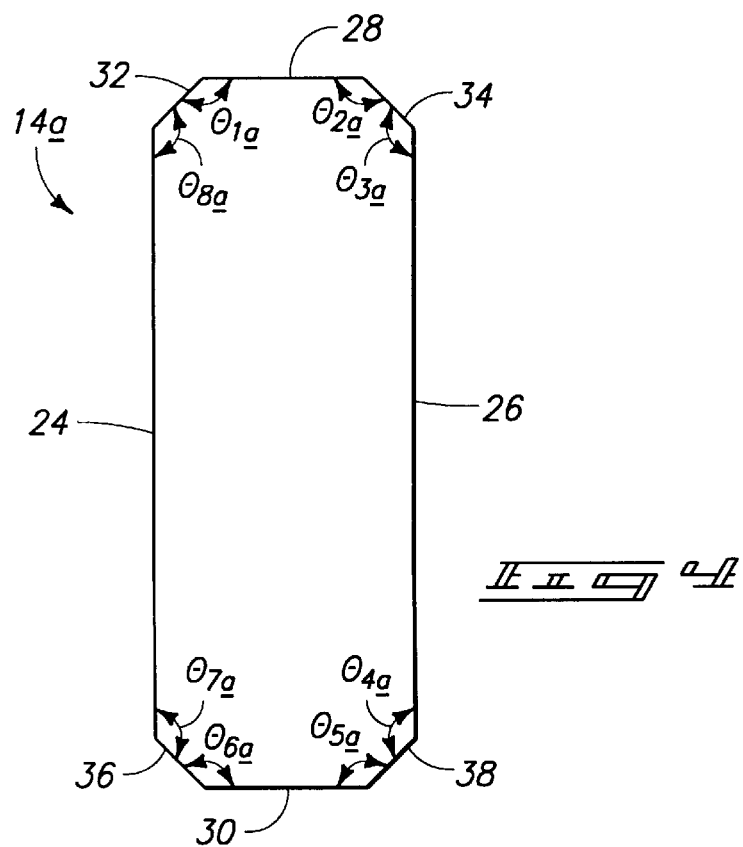

SEMICONDUCTOR WAFER ALIGNMENT PROCESSES

TECHNICAL FIELD

The present invention relates to semiconductor wafer alignment processes.

BACKGROUND OF THE INVENTION

Fabrication of integrated circuitry can comprise forming multiple layers of material, one over the other, and patterning and etching such layers to form various integrated circuit devices. It is highly desirable that precise alignment occur when one layer is formed over another layer and subsequently etched to form a device. Typically, alignment can be maintained between adjacent elevationally displaced layers in a number of different ways. One way is to use alignment marks in so-called scribe areas of the wafer intermediate die areas where active devices are to be formed. The scribe areas can then be inspected either visually or through automated means, and alignment of the layers ascertained.

One alignment regime is referred to as box-in-box alignment because elevationally displaced boxes are formed and examined relative to one another to ascertain whether the layers within which the boxes are formed are aligned. Specifically, a large box might be formed on one layer. A layer overlying the large box will have a layer of photoresist patterned thereover. The patterned layer of photoresist will contain integrated circuitry patterns as well as, over the scribe area and larger box, a smaller box which preferably has an inspectible positional relationship relative to the underlying larger box. The smaller box is typically formed to be received entirely within the larger box when inspected from a position over the wafer or substrate. When inspected, if the smaller box is offset relative to the larger box, one can ascertain that an undesirable misalignment has occurred with the photoresist which can be subsequently cured by removing the photoresist and reapplying it.

One problem associated with alignment pattern usage is that the metrology equipment which is utilized to inspect and ascertain alignment (or for that matter a human inspector) can sometimes have the job complicated by the fact that one or more of the alignment marks can have portions which are undesirably missing or removed. For example, it is often desirable to planarize certain layers of a wafer during processing. Oxide insulative materials such as borophosphosilicate glass (BPSG) are often mechanically abraded as by chemical mechanical polishing to ensure provision of a planar surface for a next-applied layer. Yet, such chemical mechanical polishing can, and often does affect the integrity of one or more of the formed alignment patterns. For example, in the context of box-in-box alignment patterns, portions of the abrupt corners of the boxes can be worn away by the chemical mechanical polishing. Subsequent inspection is made much more difficult because the complete alignment picture is not easily ascertained from the incomplete alignment patterns.

This invention arose out of concerns associated with providing improved methods of ascertaining alignment during semiconductor wafer processing.

SUMMARY OF THE INVENTION

Semiconductor wafer alignment processes are described. In one embodiment, a first geometric shape is formed over a substrate and has a plurality of sides. A majority of the sides are formed along lines which intersect with another side's line at angles greater than 90°. A second geometric shape is formed over the first geometric shape and is substantially the same as, but different in dimension from the first geometric shape. The position of the shapes is inspected relative to one another to ascertain whether the shapes are misaligned.

In another embodiment, an enclosed polygon is formed over the substrate and each of the polygon's sides is joined with another of the polygon's sides to define an angle greater than 90°. A shape is provided elevationally displaced from and received entirely inside the polygon when viewed from over the substrate. The relative positions of the polygon and the elevationally displaced shape are inspected for alignment.

In another embodiment, a first shape is formed over a substrate and is defined by a side at least a portion of which is arcuate. A second shape is formed elevationally displaced from the first shape and is defined by a side at least a portion of which is arcuate. The second shape is different in dimension from the first shape. The relative positions of the first and second shapes are inspected to ascertain whether the shapes are properly aligned.

BRIEF DESCRIPTION OF THE DRAWINGS

Preferred embodiments of the invention are described below with reference to the following accompanying drawings.

FIG. 3 is a view of the FIG. 2 wafer fragment at a different processing step.

FIG. 4 is a view of an alignment pattern which can be used in accordance with one or more embodiments of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
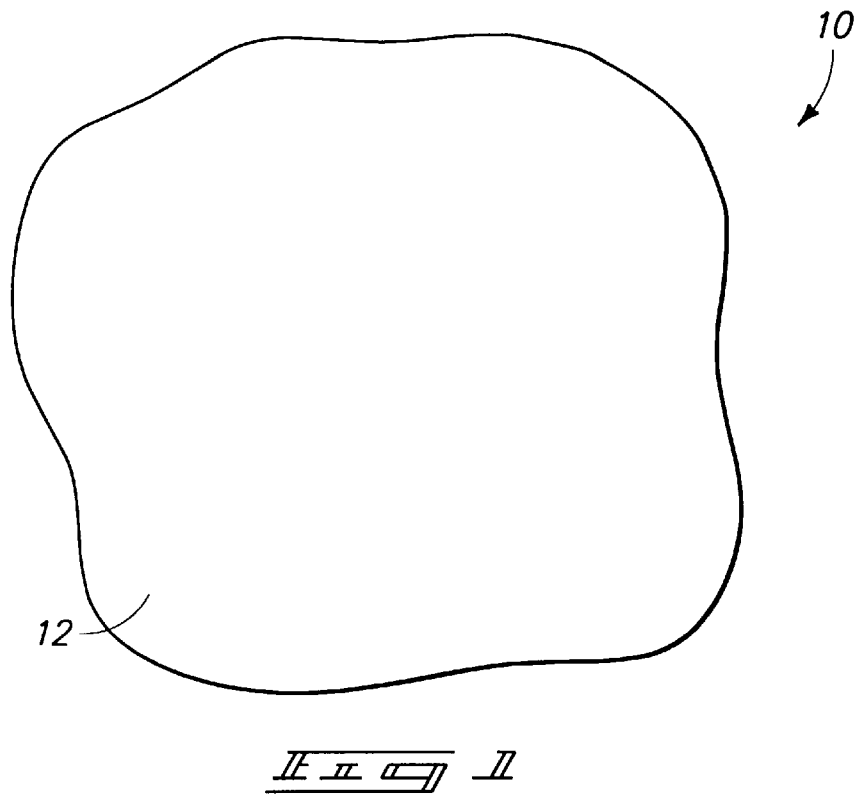
FIG. 1 is a top plan view of a semiconductor wafer fragment in process in accordance with one embodiment of the invention.

Referring to FIG. 1, a semiconductor wafer fragment in process is shown generally at 10 and comprises a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
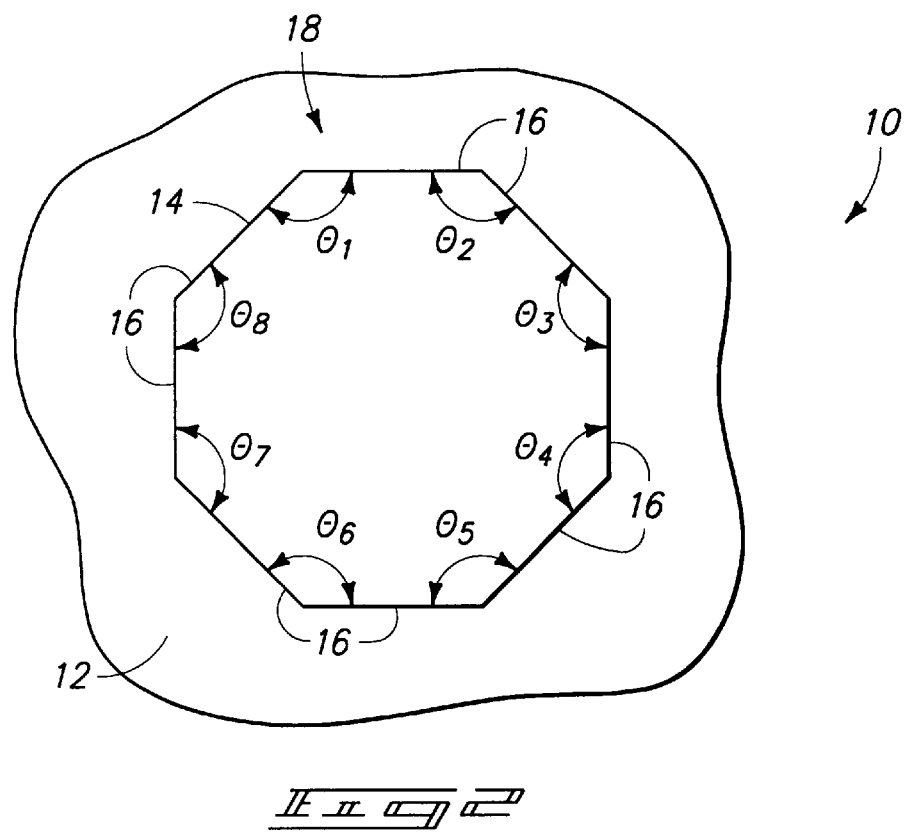
FIG. 2 is a view of the FIG. 1 wafer fragment at a different processing step and shows one alignment pattern in accordance with one embodiment of the invention.

Referring to FIG. 2, a first geometric shape or alignment mark 14 is formed over the substrate and has a plurality of sides 16. First shape 14 is typically received by one of the layers overlying the substrate, e.g. a BPSG layer. In one embodiment, a majority of sides 16 are formed along lines which intersect with another side at angles greater than 90°. In the illustrated example, sides 16 are joined with one another to form an enclosed first polygon 18 having an area. Polygon 18 can have more than four, five, six, or seven sides. In the illustrated example, polygon 18 has no more than and preferably eight sides.

Sides 16 of polygon 18, in this embodiment, intersect to define plurality of angles $\theta_{1-8}$ therebetween. Sides 16 can have the same or different lengths. In this example, sides 16 are all the same length, and each of $\theta_{1-8}$ is greater than 90°. It is possible, of course, to have a polygon 18 with less than all of its interior angles greater than 90°, and/or with sides having different lengths. In a preferred embodiment, however, at least four of the angles, and preferably all eight of the angles are greater than 90°.

Referring to FIG. 3, a second geometric shape or alignment mark 20 is formed over first geometric shape 14. Typically, second shape 20 will be patterned into an overlying layer of photoresist so that alignment between first and second shapes 14, 20 can be ascertained. In this example, second shape 20 comprises or constitutes an enclosed polygon having more than four sides and a shape and an area. Preferably, the area of the second enclosed polygon is different from the area of first enclosed polygon 14. In the illustrated and preferred embodiment, second geometric shape 20 is substantially the same as, but different in dimension or area from first geometric shape 14. Accordingly, second geometric shape 20 has a plurality of sides 22 which are formed along lines which intersect with one another at angles greater than 90°. It is possible, however, for second shape 20 to be different from first shape 14. Most preferably, the second shape is identical to the first, but for size.

Preferably, one of the first and second shapes 14, 20 is received entirely within the other of the first and second shapes when viewed from over the substrate. In this example, a smaller of the shapes, shape 20, is formed elevationally over first geometric shape 14 and received entirely therewithin when viewed from over the substrate. It is possible, however, for the smaller of the shapes to be formed elevationally under the larger of the shapes. Regardless, the first and second shapes, in this embodiment, are elevationally displaced relative to one another. Other shapes having arcuate portions could, of course, be used. Examples include ovals, ellipses and the like.

Alternately considered, the first and second geometric shapes preferably define enclosed polygons having more than four sides at least some of which being joined with one another to define angles which are greater than 90°. In one embodiment, both first and second polygons comprise the same number of sides. In this example, each polygon has eight sides.

In another embodiment, a multi-sided shape is formed over substrate 12 and has at least three sides which are joined to define angles greater than 90°. In the illustrated example, one possible multi-sided shape is exemplified by shape 14. A second shape is formed over substrate 12 and elevationally displaced from multi-sided shape 18. With first and second shapes having been formed, the positioning of the shapes relative to one another can now be inspected to ascertain whether the shapes are misaligned. Typically, equidistance positioning of the sides of each shape relative to the corresponding closest side of an overlying or underlying shape signifies that the shapes are desirably aligned.

Referring to FIG. 4, a first geometric shape is shown generally at 14a in accordance with an alternate embodiment of the present invention. Like numerals from the above-described embodiment have been utilized where appropriate with differences being indicated by the suffix "a" or with different numerals. Shape 14a constitutes a first alignment mark having first and second pairs of generally parallel sides with first and second respective lengths. Sides 24, 26 comprise a first pair of the generally parallel sides. Sides 28, 30 comprise a second pair of generally parallel sides. Alignment mark 14a also includes two pairs of joinder sides each of which joining one side of the first pair of parallel sides with one side of the second pair of parallel sides. Specifically, sides 32, 34 comprise a first pair of joinder sides which join sides 24, 26, and 28. Sides 36, 38 comprise a second pair of joinder sides which join sides 24, 26, and 30.

Joinder sides 32–38 together with sides 24–30 define an enclosed structure having eight inside angles $\theta_{1a-8a}$, at least one of which, and preferably all of which are greater than 90°. Of course, it is possible for less than eight of the angles to be greater than 90°. For example, two, three, four, five, six, or seven of the angles could be greater than 90°. In this example, the length of the first and second pairs of sides and the joinder sides are different from one another.

Figure 5:
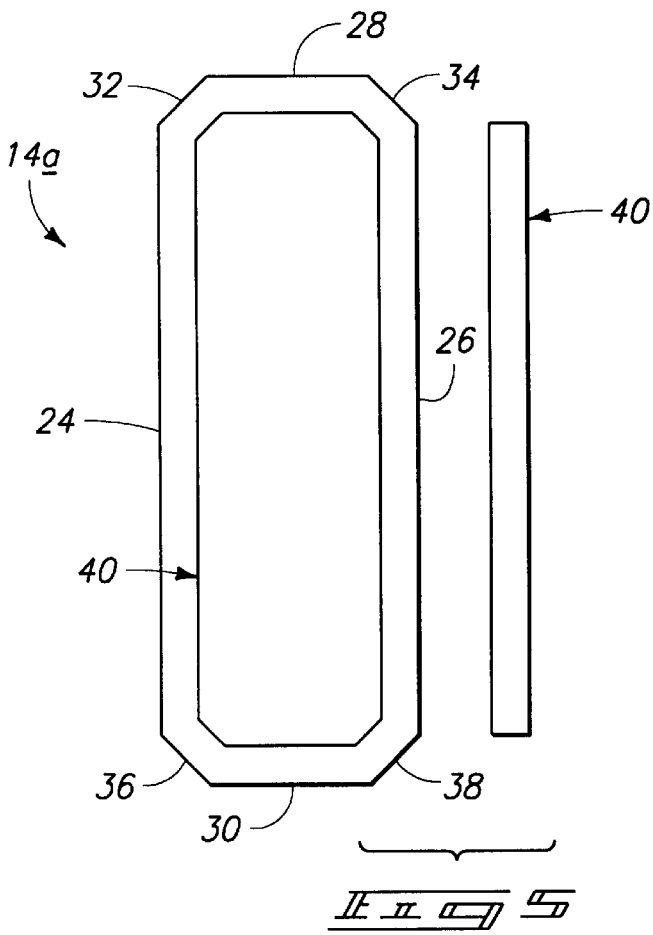
FIG. 5 is a view of the FIG. 4 alignment pattern in connection with other alignment patterns which can be utilized in connection with one or more embodiments of the invention.

Referring to FIG. 5, second alignment marks 40 are formed over the substrate, with one of the first and second alignment marks being formed elevationally over the other of the first and second alignment marks. In this example, the smaller of the alignment marks, e.g. second alignment marks 40 are formed over the first alignment mark 14a. Alignment marks 40 are different alignment marks which could individually, and without the other alignment mark 40, be formed over the substrate and used for subsequent alignment processing. Both are presented here together only to illustrate that separate types of alignment marks can be used in connection with first alignment mark 14a. For example, the leftmost second alignment mark 40 is formed to be received entirely inside of first shape or alignment mark 14a. Alignment processing relative to these two alignment marks would take place substantially as described above with respect to FIGS. 2 and 3. Alternately, the rightmost alignment mark 40 is received entirely outwardly of first alignment mark 14a. In this instance, inspection of the positions of the alignment marks could ascertain a misalignment due to a spacing variation relative to rightmost alignment mark 40 and alignment mark 14a.

Figure 6:
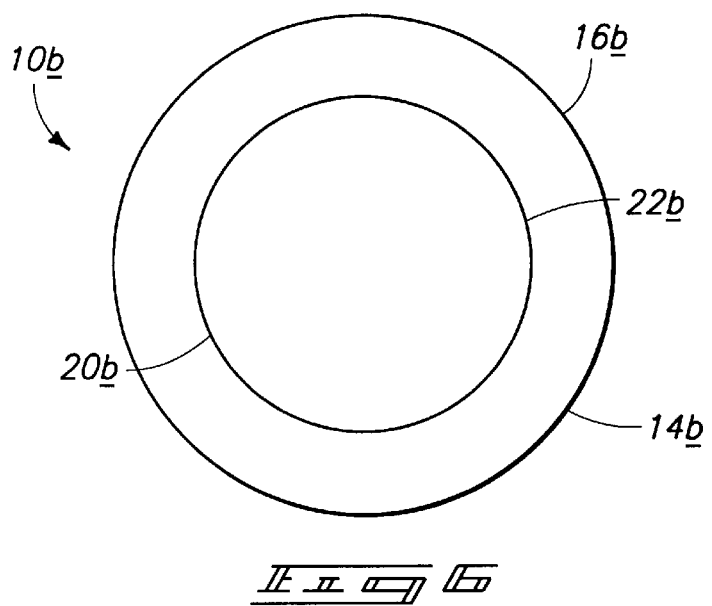
FIG. 6 is a view of a pair of alignment patterns which can be utilized in connection with one or more embodiments of the invention.

Referring to FIG. 6, an alternate embodiment of the present invention is set forth generally at 10b. Like numerals from the above-described embodiment have been utilized where appropriate with differences being indicated by the suffix "b" or with different numerals. A first shape or alignment mark 14b is formed over the substrate and is defined by a side 16b at least a portion of which is arcuate. In a preferred embodiment, side 16b defines a generally circular shape. A second shape or alignment mark 20b is formed over the substrate and elevationally displaced from first shape 14b. The second shape is defined by a side 22b at least a portion of which is arcuate. Second shape 20b is preferably different in dimension from first shape 14b. In the illustrated and preferred embodiment, side 22b of second shape 20b defines a generally circular shape. Preferably, the smaller of the shapes is received entirely within the larger of the shapes when viewed from over the substrate. In this example, the smaller of the shapes is formed over the larger of the shapes, but such could be reversed as described above.

Advantages of the present methods include that the alignment marks or shapes have a robustness which can withstand chemical mechanical polishing or other polishing in a manner which leaves behind an easily inspectible and integrity-preserved alignment mark.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor wafer alignment process comprising:
   forming a first geometric shape over a substrate, the shape having a plurality of sides a majority of which are formed along lines which intersect with another side at angles greater than 90°;
   forming a second geometric shape over the first geometric shape, the second geometric shape being substantially the same as but different in dimension from the first geometric shape; and
   inspecting the positioning of the shapes relative to one another and ascertaining whether the shapes are misaligned.

2. The semiconductor wafer alignment process of claim 1, wherein the forming of the first and second geometric shapes comprises forming one of the shapes to be received entirely within the other of the shapes when viewed from over the substrate.

3. The semiconductor wafer alignment process of claim 1, wherein the forming of the second geometric shape comprises forming said shape to be smaller in dimension than the first geometric shape.

4. The semiconductor wafer alignment process of claim 1, wherein the forming of the first geometric shape comprises forming the sides thereof along lines which intersect to define at least four angles of greater than 90°.

5. The semiconductor wafer alignment process of claim 1, wherein the forming of the first geometric shape comprises forming the sides thereof along lines which intersect to define eight angles of greater than 90°.

6. The semiconductor wafer alignment process of claim 1, wherein the forming of the first geometric shape comprises forming the sides thereof to have lengths which are generally all the same.

7. The semiconductor wafer alignment process of claim 1, wherein the forming of the first geometric shape comprises forming some of the sides thereof to have lengths which are different from one another.

8. The semiconductor wafer alignment process of claim 1, wherein the forming of the first geometric shape comprises forming the sides thereof along lines which intersect to define at least four angles of greater than 90°, wherein the sides thereof have lengths which are generally all the same.

9. The semiconductor wafer alignment process of claim 1, wherein the forming of the first geometric shape comprises forming the sides thereof along lines which intersect to define at least four angles of greater than 90°, wherein some of the sides thereof have lengths which are different from one another.

10. The semiconductor wafer alignment process of claim 1, wherein the forming of the first geometric shape comprises forming the sides thereof along lines which intersect to define eight angles of greater than 90°, wherein the sides thereof have lengths which are generally all the same.

11. The semiconductor wafer alignment process of claim 1, wherein the forming of the first geometric shape comprises forming the sides thereof along lines which intersect to define eight angles of greater than 90°, wherein some of the sides thereof have lengths which are different from one another.

12. A semiconductor wafer alignment process comprising:
    forming an enclosed polygon over a substrate, the polygon having a plurality of sides which are joined together, each of the sides being joined with another of the sides to define an angle greater than 90°;
    providing a shape elevationally displaced from and received entirely inside the polygon when viewed from over the substrate; and
    inspecting the relative positions of the polygon and the elevationally displaced shape and ascertaining therefrom whether the polygon and shape are misaligned.

13. The semiconductor wafer alignment process of claim 12, wherein the forming of the enclosed polygon comprises forming the polygon to have more than four sides.

14. The semiconductor wafer alignment process of claim 12, wherein the forming of the enclosed polygon comprises forming the polygon to have more than five sides.

15. The semiconductor wafer alignment process of claim 12, wherein the forming of the enclosed polygon comprises forming the polygon to have more than six sides.

16. The semiconductor wafer alignment process of claim 12, wherein the forming of the enclosed polygon comprises forming the polygon to have more than seven sides.

17. The semiconductor wafer alignment process of claim 12, wherein the forming of the enclosed polygon comprises forming the polygon to have no more than eight sides.

18. The semiconductor wafer alignment process of claim 12, wherein the providing of the shape comprises providing the shape elevationally over the polygon.

19. The semiconductor wafer alignment process of claim 12, wherein the providing of the shape comprises providing the shape elevationally under the polygon.

20. The semiconductor wafer alignment process of claim 12, wherein the providing of the shape comprises forming the shape to be the same shape as the enclosed polygon.

21. The semiconductor wafer alignment process of claim 12, wherein the forming of the enclosed polygon comprises forming the polygon to have more than four sides, and wherein the providing of the shape comprises forming the shape to be the same shape as the enclosed polygon.

22. The semiconductor wafer alignment process of claim 12, wherein the forming of the enclosed polygon comprises forming the polygon to have more than five sides, and wherein the providing of the shape comprises forming the shape to be the same shape as the enclosed polygon.

23. The semiconductor wafer alignment process of claim 12, wherein the forming of the enclosed polygon comprises forming the polygon to have more than six sides, and wherein the providing of the shape comprises forming the shape to be the same shape as the enclosed polygon.

24. The semiconductor wafer alignment process of claim 12, wherein the forming of the enclosed polygon comprises forming the polygon to have more than seven sides, and wherein the providing of the shape comprises forming the shape to be the same shape as the enclosed polygon.

25. The semiconductor wafer alignment process of claim 12, wherein the forming of the enclosed polygon comprises forming the polygon to have no more than eight sides, and wherein the providing of the shape comprises forming the shape to be the same shape as the enclosed polygon.

26. A semiconductor wafer alignment process comprising:
    forming a first shape over a substrate, the first shape being defined by a side at least a portion of which is arcuate;
    forming a second shape elevationally displaced from the first shape, the second shape being defined by a side at least a portion of which is arcuate, the second shape being different in dimension from the first shape; and inspecting the relative positioning of the first and second shapes to ascertain whether the shapes are properly aligned.

27. The semiconductor wafer alignment process of claim 26, wherein the smaller of the shapes is formed over the larger of the shapes.

28. The semiconductor wafer alignment process of claim 26, wherein the smaller of the shapes is received entirely within the larger of the shapes when viewed from over the substrate.

29. The semiconductor wafer alignment process of claim 26, wherein the smaller of the shapes is formed over the larger of the shapes, and is received entirely within the larger of the shapes when viewed from over the substrate.

30. The semiconductor wafer alignment process of claim 26, wherein the side of one of the first and second shapes defines a generally circular shape.

31. The semiconductor wafer alignment process of claim 26, wherein the sides of both of the first and second shapes defines a generally circular shape.

32. A semiconductor wafer alignment process comprising:

forming a first enclosed polygon over a substrate and having more than four sides and a shape and an area;

forming a second enclosed polygon over the substrate and having more than four sides and a shape and an area, the area of the second enclosed polygon being different from the area of the first enclosed polygon, the second enclosed polygon being elevationally displaced from the first enclosed polygon over the substrate, one of the first and second enclosed polygons being received entirely inside the other of the first and second enclosed polygons when viewed from over the substrate; and inspecting the relative positioning of the first and second enclosed polygons and ascertaining therefrom whether the polygons are misaligned relative to one another.

33. The semiconductor wafer alignment process of claim 32, wherein the forming of the first enclosed polygon comprises forming the polygon to have eight sides.

34. The semiconductor wafer alignment process of claim 32, wherein the forming of the second enclosed polygon comprises forming the polygon to have eight sides.

35. The semiconductor wafer alignment process of claim 32, wherein the forming of the first enclosed polygon comprises forming the polygon to have eight sides, and the forming of the second enclosed polygon comprises forming the polygon to have eight sides.

36. The semiconductor wafer alignment process of claim 32, wherein the forming of the first and second enclosed polygons comprises forming the polygons to have the same numbers of sides.

37. The semiconductor wafer alignment process of claim 32, wherein the forming of the first enclosed polygon comprises forming the polygon to have its sides joined to define at least three angles greater than 90°.

38. The semiconductor wafer alignment process of claim 32, wherein the forming of the second enclosed polygon comprises forming the polygon to have its sides joined to define at least three angles greater than 90°.

39. The semiconductor wafer alignment process of claim 32, wherein:

the forming of the first enclosed polygon comprises forming the polygon to have its sides joined to define at least three angles greater than 90°; and the forming of the second enclosed polygon comprises forming the polygon to have its sides joined to define at least three angles greater than 90°.

40. The semiconductor wafer alignment process of claim 32, wherein:

the forming of the first and second enclosed polygons comprises forming the polygons to have the same numbers of sides;

the forming of the first enclosed polygon comprises forming the polygon to have its sides joined to define at least three angles greater than 90°; and the forming of the second enclosed polygon comprises forming the polygon to have its sides joined to define at least three angles greater than 90°.

41. A semiconductor wafer alignment process comprising:

forming a multi-sided shape over a substrate, the shape having at least three sides which are joined to define angles greater than 90°;

forming a second shape over the substrate and elevationally displaced from the multi-sided shape; and inspecting the relative positioning of the two shapes and ascertaining therefrom whether the shapes are misaligned.

42. The semiconductor wafer alignment process of claim 41, wherein the forming of the multi-sided shape comprises forming at least four of the sides to be joined to define angles greater than 90°.

43. The semiconductor wafer alignment process of claim 41, wherein the forming of the multi-sided shape comprises forming at least five of the sides to be joined to define angles greater than 90°.

44. The semiconductor wafer alignment process of claim 41, wherein the second shape is substantially the same as the multi-sided shape, with one of the shapes being smaller in dimension than the other of the shapes, and further wherein the smaller of the shapes is received entirely inside the larger of the shapes when viewed from a point over the substrate.

45. The semiconductor wafer alignment process of claim 44, wherein the forming of the multi-sided shape comprises forming said shape to have its sides joined to define no more than eight angles greater than 90°.

46. A semiconductor wafer alignment process comprising:

forming a first alignment mark over a substrate, the alignment mark comprising:

first and second pairs of generally parallel sides having first and second respective lengths, and two pairs of joinder sides each of which joining one side of the first pair of parallel sides with one side of the second pair of parallel sides to define an enclosed structure having eight inside angles at least one of which being greater than 90°; and forming a second alignment mark over the substrate, one of the first and second alignment marks being formed elevationally over the other of the first and second alignment marks; and inspecting the first and second alignment marks and ascertaining therefrom whether the alignment marks are aligned.

47. The semiconductor wafer alignment process of claim 46, wherein the first and second lengths are different from one another.

48. The semiconductor wafer alignment process of claim 46, wherein two of the inside angles are greater than 90°.

49. The semiconductor wafer alignment process of claim 46, wherein four of the inside angles are greater than 90°.

50. The semiconductor wafer alignment process of claim 46, wherein eight of the inside angles are greater than 90°.

* * * * *